United States Patent
Wada et al.

(10) Patent No.: US 9,589,729 B2
(45) Date of Patent: Mar. 7, 2017

(54) MULTILAYER CERAMIC CAPACITOR

(71) Applicant: Murata Manufacturing Co., Ltd., Nagaokakyo-shi, Kyoto-fu (JP)

(72) Inventors: Hiroyuki Wada, Nagaokakyo (JP); Kohei Shimada, Nagaokakyo (JP); Kenji Takagi, Nagaokakyo (JP); Tomomi Koga, Nagaokakyo (JP); Tomotaka Hirata, Nagaokakyo (JP); Hitoshi Nishimura, Nagaokakyo (JP); Hiroki Awata, Nagaokakyo (JP); Sui Uno, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 5 days.

(21) Appl. No.: 14/855,571

(22) Filed: Sep. 16, 2015

(65) Prior Publication Data

US 2016/0005543 A1 Jan. 7, 2016

Related U.S. Application Data

(63) Continuation of application No. PCT/JP2014/052674, filed on Feb. 5, 2014.

(30) Foreign Application Priority Data

Mar. 19, 2013 (JP) ................. 2013-056671

(51) Int. Cl.
*H01G 4/30* (2006.01)
*H01G 2/24* (2006.01)
(Continued)

(52) U.S. Cl.
CPC ............... *H01G 4/30* (2013.01); *H01G 2/24* (2013.01); *H01G 4/012* (2013.01); *H01G 4/12* (2013.01);
(Continued)

(58) Field of Classification Search
CPC H01G 4/30; H01G 4/12; H01G 4/012; H01G 4/248; H01G 4/008; H01G 4/1227
See application file for complete search history.

(56) References Cited

U.S. PATENT DOCUMENTS 8,213,152 B2 * 7/2012 Taniguchi ............ H01G 4/012
361/306.3
8,531,817 B2 * 9/2013 Yoshida ............... H01C 1/1406
361/303
(Continued)

FOREIGN PATENT DOCUMENTS

| JP | 4-288809 A | 10/1992 |
|---|---|---|
| JP | 6-084692 A | 3/1994 |
| JP | 6-204075 A | 7/1994 |
| JP | 2000-003806 A | 1/2000 |
| JP | 2011-14940 A | 1/2011 |

OTHER PUBLICATIONS

Official Communication issued in International Patent Application No. PCT/JP2014/052674, mailed on Apr. 15, 2014.

*Primary Examiner* — Nguyen Ha
(74) *Attorney, Agent, or Firm* — Keating & Bennett, LLP

(57) ABSTRACT

A multilayer ceramic capacitor includes a laminated body including an inner layer portion including ceramic dielectric layers and internal electrodes, and outer layer portions including ceramic dielectric layers. External electrodes connected to the internal electrodes are provided on both ends of the laminated body. The main constituent of the inner layer portion is a perovskite-type compound represented by $ABO_3$. The outer layer portions include first outer layers and second outer layers respectively containing oxides that differ from each other in main constituents, and boundary reaction layers are provided between the first outer layers and the second outer layers. First ceramic dielectric layers outside the boundary reaction layers differ in color from second ceramic dielectric layers inside the boundary reaction layers.

16 Claims, 2 Drawing Sheets

(51) Int. Cl.
*H01G 4/12* (2006.01)
*H01G 4/224* (2006.01)
*H01G 4/012* (2006.01)
*H01G 4/242* (2006.01)
*H05K 1/18* (2006.01)
*H05K 3/30* (2006.01)
*H01G 4/232* (2006.01)

(52) U.S. Cl.
CPC ......... *H01G 4/1209* (2013.01); *H01G 4/1236* (2013.01); *H01G 4/1245* (2013.01); *H01G 4/224* (2013.01); *H01G 4/232* (2013.01); *H01G 4/242* (2013.01); *H05K 1/181* (2013.01); *H05K 3/30* (2013.01); *H01G 4/1227* (2013.01); *H05K 2201/10015* (2013.01)

(56) References Cited

U.S. PATENT DOCUMENTS

| | | | |
|---|---|---|---|
| 9,099,246 B1* | 8/2015 | Kitano | H01G 4/1227 |
| 2006/0187612 A1* | 8/2006 | Yamane | H01G 4/005 |
| | | | 361/303 |
| 2012/0257322 A1* | 10/2012 | Shiota | H01G 4/012 |
| | | | 361/301.4 |
| 2012/0319536 A1* | 12/2012 | Sakuratani | H01G 4/30 |
| | | | 310/366 |

* cited by examiner

MULTILAYER CERAMIC CAPACITOR

BACKGROUND OF THE INVENTION

1. Field of the Invention

The present invention relates to a multilayer ceramic capacitor including a dielectric ceramic.

2. Description of the Related Art

In general, a multilayer ceramic capacitor is composed of a laminated body in the form of a cuboid and external electrodes. The laminated body has ceramic dielectric layers, and internal electrodes disposed to be opposed to each other between the ceramic dielectric layers and extended to both ends of the laminated body. The external electrodes are connected to the extended internal electrodes at both ends of the laminated body. This laminated body includes an inner layer part and outer layer parts. The inner layer part has a plurality of internal electrodes disposed to be opposed to each other. The outer layer parts each refer to a part between two internal electrodes disposed outermost among the plurality of internal electrodes and side surfaces of the laminated body opposed to the two internal electrodes, that is, a part of the laminated body outside the inner layer part. The outer layer parts and the inner layer part are typically formed from the same material (for example, see Japanese Patent Application Laid-Open No. 6-084692).

In addition, in mounting the multilayer ceramic capacitor onto a circuit board, depending on the orientation of the multilayer ceramic capacitor, the circuit board may be disposed parallel to the internal electrodes, or the circuit board may be disposed perpendicular to the internal electrodes. The multilayer ceramic capacitor may, depending on such a positional relationship between the circuit board and the internal electrodes, vary in floating capacitance value to influence characteristics of the multilayer ceramic capacitor.

Therefore, for mounting the multilayer ceramic capacitor onto a circuit board, when the multilayer ceramic capacitor is packaged with the orientation of the internal electrodes aligned in advance so as to make uniform the positional relationship between the circuit board and the internal electrodes, the capacitor can be mounted so as to align the positional relationship between the circuit board and the internal electrodes, and variations in characteristics of the multilayer ceramic capacitor can be reduced.

However, because the internal electrodes are buried in the laminated body, there has been a problem that it is difficult to recognize the laminating direction of the internal electrodes by the appearance of the multilayer ceramic capacitor when the multilayer ceramic capacitor is square or rectangular close to square in cross section.

SUMMARY OF THE INVENTION

Therefore, preferred embodiments of the present invention provide a multilayer ceramic capacitor which is able to indicate a mounting orientation in a case of mounting the multilayer ceramic capacitor onto a board or substrate.

A multilayer ceramic capacitor according to a preferred embodiment of the present invention includes a laminated body including an inner layer portion that includes a plurality of ceramic dielectric layers laminated, with internal electrodes provided on the plurality of ceramic dielectric layers, and an outer layer portion that includes a plurality of ceramic dielectric layers laminated outside the inner layer portion, with no internal electrodes provided on the plurality of ceramic dielectric layers; and external electrodes provided on both ends of the laminated body, wherein the inner layer portion contains, as its main constituent, a perovskite-type compound represented by $ABO_3$ (where A represents one or more of Ba, Sr, and Ca, B represents one or more of Ti, Zr, and Hf, and O represents oxygen), the outer layer portion includes at least: as an outermost layer, a first outer layer containing an oxide as its main constituent, and a second outer layer containing, as its main constituent, an oxide that is different from the oxide of the first outer layer, a boundary reaction layer is disposed between the first outer layer and the second outer layer, and further, the boundary reaction layer contains at least one element other than oxygen among elements constituting the oxide in the first outer layer adjacent to the boundary reaction layer, and at least one element other than oxygen among elements constituting the oxide in the second outer layer adjacent to the boundary reaction layer, and a surface of the first outer layer differs in color from a surface of the inner layer portion.

In addition, in a multilayer ceramic capacitor according to a preferred embodiment of the present invention, the oxide in the second outer layer is preferably a perovskite-type compound.

Furthermore, in a multilayer ceramic capacitor according to a preferred embodiment of the present invention, the oxide in the first outer layer is preferably a perovskite-type compound.

In a multilayer ceramic capacitor according to a preferred embodiment of the present invention, the first outer layer of the laminated body differs in surface color from the inner layer portion. Therefore, the laminating direction of the internal electrodes is able to be confirmed from the appearance of the multilayer ceramic capacitor, and the multilayer ceramic capacitor is able to be mounted in consideration of the positional relationship between a board and the internal electrodes of the multilayer ceramic capacitor.

In addition, in a multilayer ceramic capacitor according to a preferred embodiment of the present invention, characteristics of the multilayer ceramic capacitor are improved when the oxide in the second outer layer or in the first outer layer is a perovskite-type compound.

According to a preferred embodiment of the present invention, the planar orientation of the internal electrodes is able to be reliably determined by virtue of the difference in color at side surfaces of the laminated body of the multilayer ceramic capacitor. Therefore, in the case of mounting the multilayer ceramic capacitor onto a board, substrate or the like, the multilayer ceramic capacitor is able to be mounted on the board or substrate in consideration of the positional relationship between the board or substrate and the internal electrodes in the laminated body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
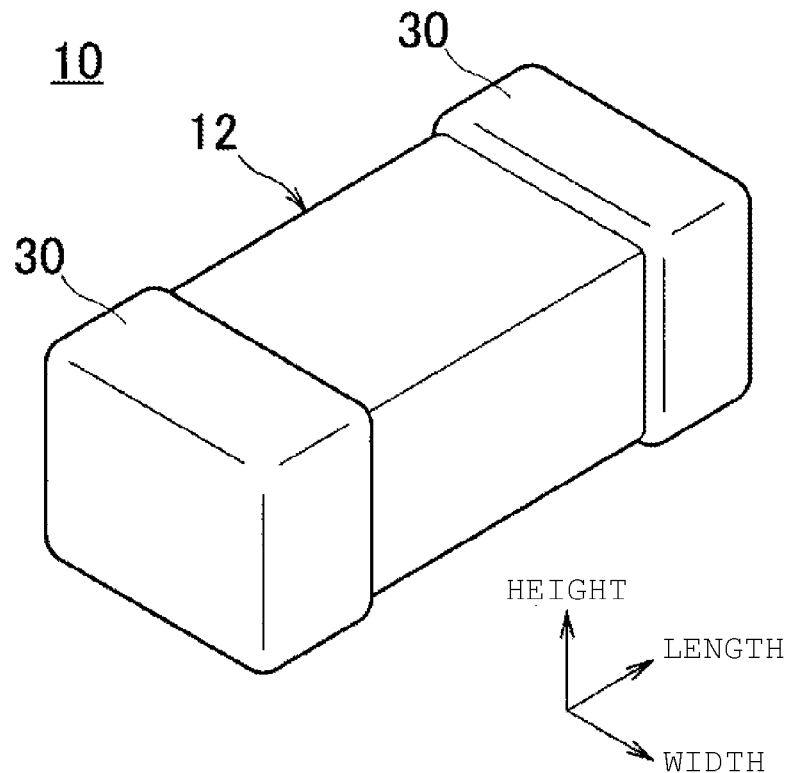
FIG. 1 is an external perspective view illustrating a multilayer ceramic capacitor according to a preferred embodiment of the present invention.
Figure 2:
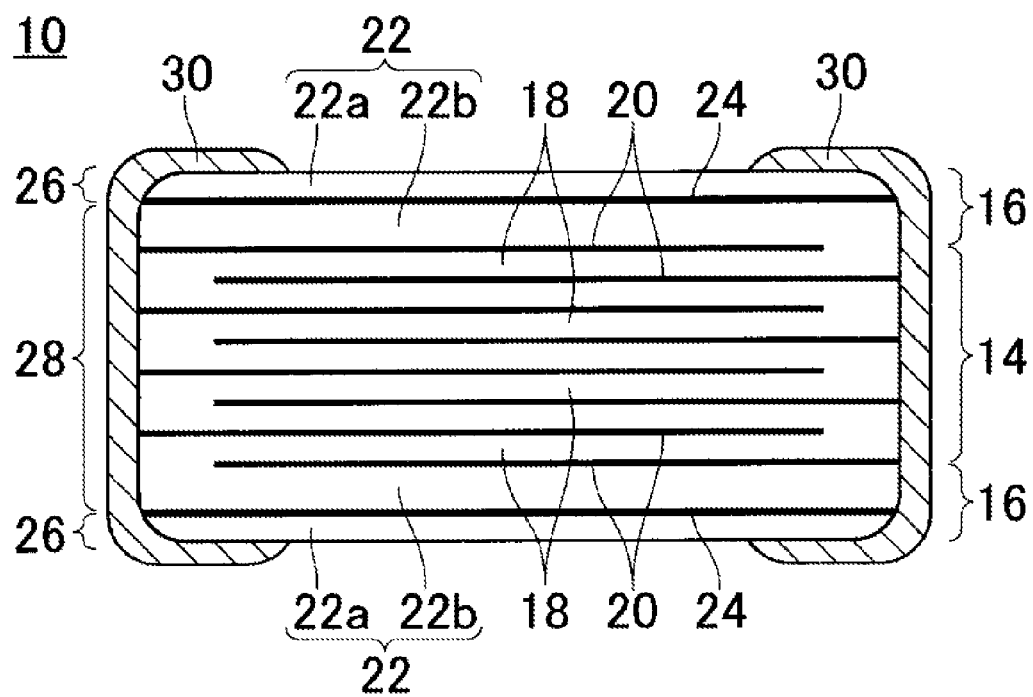
FIG. 2 is a cross-sectional view illustrating the internal structure of the multilayer ceramic capacitor shown in FIG. 1.

FIG. 1 is an external perspective view illustrating a multilayer ceramic capacitor according to a preferred embodiment of the present invention. FIG. 2 is a cross-sectional view illustrating the internal structure of the multilayer ceramic capacitor shown in FIG. 1.

The multilayer ceramic capacitor 10 includes a laminated body 12 in the form of, for example, a cuboid. The laminated body 12 includes ceramic dielectric layers and internal electrodes laminated alternately, and may be square or rectangular in cross-sectional shape including the width direction and the height direction. The ceramic dielectric layers constituting the laminated body 12 preferably have a thickness on the order of about 0.5 μm to about 5 μm, and the total number of layers laminated is 100 to 600, for example.

The laminated body 12 includes an inner layer portion 14 and outer layer portions 16 as shown in FIG. 2.

The inner layer portion 14 includes a plurality of ceramic dielectric layers 18 and internal electrodes 20 alternately laminated. The adjacent internal electrodes 20 are opposed to each other with the ceramic dielectric layer 18 interposed therebetween. Further, the plurality of internal electrodes 20 is extended alternately to two end surfaces of the laminated body 12 opposed to each other. More specifically, the adjacent internal electrodes 20 are respectively extended to the different end surfaces of the laminated body 12. The internal electrodes 20 are preferably formed from, for example, Ni or Cu, and laminated to have on the order of 80 to 500 sheets of electrodes, for example. The inner layer portion 14 defines a portion of the laminated body 12, and refers to the range between the two internal electrodes 20 at both ends among the internal electrodes 20 laminated.

The outer layer portions 16 include a plurality of ceramic dielectric layers 22 with no internal electrode 20 provided therein, and disposed so as to sandwich both sides of the inner layer portion 14. Boundary reaction layers 24 are provided midway in the outer layer portions 16. More specifically, first outer layers 22a are disposed outside the boundary reaction layers 24, whereas second outer layers 22b are disposed inside the boundary reaction layers 24. More specifically, the first outer layers 22a define outermost layers.

It is to be noted that the first outer layers 22a and the second outer layers 22b may each correspond to one sheet of ceramic dielectric layer, or a plurality of ceramic dielectric layers.

Further, the respective outer layer portions 16 that sandwich the both sides of the inner layer portion 14 may differ in thickness. Further, still other outer layers may be disposed between the second outer layers 22b and the inner layer portion 14.

It is to be noted that first ceramic dielectric layers 26 are different in color from second ceramic dielectric layers 28 and are preferably white in color. In this regard, the first ceramic dielectric layers 26 correspond with the first outer layers 22a of the outer layer portions 16, which is disposed outside the boundary reaction layers 24. In addition, the second ceramic dielectric layers 28 include the ceramic dielectric layers 18 of the inner layer portion 14, and the second outer layers 22b of the outer layer portions 16, which are disposed inside the boundary reaction layers 24. It is to be noted that the boundary reaction layers 24 may be provided between the inner layer portion 14 and the outer layer portions 16. In this case, the ceramic dielectric layers 22 constituting the outer layer portions 16 all correspond to the first ceramic dielectric layers 26, whereas the ceramic dielectric layers 18 constituting the inner layer portion 14 all correspond to the second ceramic dielectric layers 28. Thus, the inner layer portion 14 and the outer layer portions 16 are able to be strongly coupled. In addition, the side surfaces of the laminated body 12 at ends in the laminating direction (side surfaces including the width direction and length direction in FIG. 1) is able to be distinguished from the side surfaces with ends of the second ceramic dielectric layers 28 exposed (side surfaces including the height direction and length direction in FIG. 1). More specifically, the side surface of the laminated body 12 at the both ends in the laminating direction is able to be distinguished by the color of the first ceramic dielectric layers 26.

The main constituent of the ceramic dielectric layers constituting the second ceramic dielectric layers 28 is a perovskite-type compound represented by $ABO_3$. In this regard, A contains one or more of Ba, Sr, and Ca, B contains one or more of Ti, Zr, and Hf, and O represents oxygen. Furthermore, the ceramic dielectric layers 18 constituting the inner layer portion 14 contains Dy, Mn, Mg, and Si as additive materials.

Having the composition as mentioned above is able to be confirmed when after removing the first ceramic dielectric layers 26 with sand paper or the like, the second ceramic dielectric layers 28 left are made into a powder, dissolved in an acid, and subjected to ICP emission spectrometry.

In addition, the main constituent of the first outer layers 22a constituting the first ceramic dielectric layers 26 includes an oxide containing Ca and Zr, and Si and Mn as additive materials. In addition, the main constituent of the second outer layers 22b constituting the second ceramic dielectric layers 28 includes an oxide containing Ba and Ti, and Si as an additive material. In addition, the oxide which is the main constituent of the first outer layer 22a and second outer layer 22b is preferably perovskite-type compound.

In addition, the boundary reaction layers 24 between the first outer layers 22a and the second outer layers 22b contain at least one element other than oxygen among the elements constituting the oxide in the first outer layers 22a, and at least one element other than oxygen among the elements constituting the oxide in the second outer layers 22b.

Having the compositions as mentioned above is able to be confirmed when the first outer layers 22a and the second outer layers 22b including these main constituents are made into powders, dissolved in an acid, and subjected to ICP emission spectrometry.

Having the compositions as mentioned above is able to be also confirmed in such a way that the laminated body 12 is wrapped with a resin, and then polished to expose a cross section of the first outer layers 22a, second outer layers 22b, and boundary reaction layers 24 cut in the thickness direction, and the cross section is subjected to composition analysis by WDX.

It is to be noted that one or more elements other than oxygen, which constitute the main constituent of the second outer layers 22b, may diffuse across the boundary reaction layers 24 into the first outer layers 22a.

Further, around the boundaries between the second outer layers 22b and the boundary reaction layers 24 in the second outer layers 22b, the elements constituting the main constituent of the second outer layers 22b define the boundary reaction layers 24, and additionally, diffuse toward the first outer layers 22a as described above, so that portions in which the element concentration is made lower than the average concentration in the second outer layers 22b are formed.

External electrodes 30 extend along both ends in the longer direction of the laminated body 12 so as to be connected to the internal electrodes 20. The external electrodes 30 wrap around the four side surfaces from the end surfaces of the laminated body 12. For the external electrodes 30, underlying metal layers are formed preferably by immersing ends of the laminated body 12 in an electrode paste, and carrying out sintering. Ni plating and Sn plating are applied onto underlying metal layers to form the external electrodes 30.

In the multilayer ceramic capacitor 10 shown in FIG. 2, due to the fact that the color of the first outer layers 22a in the outer layer portion 16 of the laminated body 12 differs from the color of the inner layer portion 14, the laminating direction of the internal electrodes 20 is able to be confirmed from the appearance of the multilayer ceramic capacitor by virtue of the difference in color, and the multilayer ceramic capacitor 10 is able to be mounted in consideration of the positional relationship between a board or substrate and the internal electrodes 20 of the multilayer ceramic capacitor.

In addition, in the multilayer ceramic capacitor 10 shown in FIG. 2, while the oxides as the main constituents contained in the first outer layers 22a and the second outer layers 22b differ in the outer layer portions 16 of the laminated body 12, the first outer layers 22a and the second outer layers 22b are able to be strongly coupled because the boundary reaction layers 24 are provided at the boundary surfaces between the first outer layers 22a and the second outer layers 22b. In this regard, the fact that the oxides differ means that, except for minute amounts of elements like impurities, the constituent elements of the oxide in the first outer layers 22a include at least one or more elements that differ from the constituent elements of the oxide in the second outer layers 22b, or that the constituent elements of the oxide in the second outer layers 22b include at least one or more elements that differ from the constituent elements of the oxide in the first outer layers 22a.

It is to be noted that when the oxide as the main constituent of the second outer layers 22b and the perovskite-type compound as the main constituent of the ceramic dielectric layers 18 constituting the inner layer portion 14 are compounds of the same sort, the second outer layers 22b and the inner layer portion 14 is able to be strongly coupled.

In this regard, the same sort refers to compounds that have the same constituent elements and crystal structure, except for minute amounts of elements like impurities, and the constituent element ratios may be different.

Figure 3:
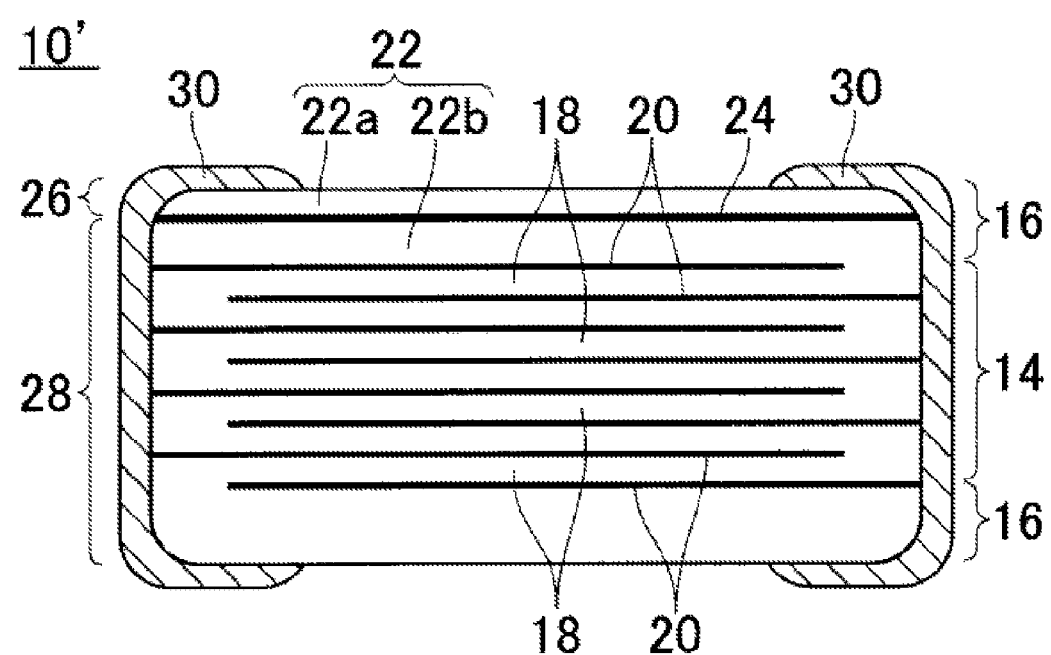
FIG. 3 is a cross-sectional view illustrating another example of the internal structure of the multilayer ceramic capacitor shown in FIG. 1.

Furthermore, another preferred embodiment of the multilayer ceramic capacitor according to a preferred embodiment of the present invention will be described. FIG. 3 is a cross-sectional view illustrating another preferred embodiment of the internal structure of the multilayer ceramic capacitor 10' according to a preferred embodiment of the present invention. The multilayer ceramic capacitor 10' includes a first outer layer 22a and a second outer layer 22b provided only on one side of an inner layer portion 14, unlike the multilayer ceramic capacitor 10. On the other side of the inner layer portion 14, the same ceramic dielectric layers as ceramic dielectric layers 18 of the inner layer portion 14 are laminated to provide an outer layer portion 16.

The multilayer ceramic capacitor 10' shown in FIG. 3 herein produces a similar effect to the above-described multilayer ceramic capacitor 10 shown in FIG. 2.

It is to be noted that the boundary reaction layers 24 are preferably drawn as continuous sheets of layers in FIGS. 2 and 3, but may be discontinuous layers.

Next, a non-limiting example of a method for manufacturing a multilayer ceramic capacitor will be described for manufacturing the multilayer ceramic capacitor 10 shown in FIG. 1.

In order to prepare the multilayer ceramic capacitor 10, $BaTiO_3$ is prepared which is a ceramic raw material powder for forming the inner layer portion 14.

For example, first, a $BaCO_3$ powder and a $TiO_2$ powder are weighed so that the ratio of Ba/Ti is 1.001, and subjected to wet mixing with a mill that uses $ZrO_2$ balls. This mixed slurry is dried, and then heated to 1000° C. to provide a $BaTiO_3$ powder of 0.16 μm in average particle size. Then, to 100 parts by mol of the $BaTiO_3$ powder, 1.0 part by mol of Dy, 1.2 parts by mol of Mg, 0.2 part by mol of Mn, and 1.0 part by mol of Ba are each added as a metal soap solution, and 1.5 parts by mol of Si is further added as an alkoxide. Subsequently, the mixture is subjected to wet mixing with a mill that uses $ZrO_2$ balls in a mixing system of toluene and ethyl alcohol as a dispersion medium. After the removal of the dispersion medium, the mixture is subjected to heat treatment at 500° C. to remove the organic component, and subjected to particle size regulation to provide a ceramic raw material powder for forming the inner layer portion 14. This ceramic raw material powder for forming the inner layer portion 14 is, with the addition of a polybutyral-based binder and a plasticizer thereto, and then with the addition of a mixed dispersion medium of toluene and ethyl alcohol thereto, subjected to wet mixing with a mill that uses $ZrO_2$ balls, thus providing slurry. Next, this slurry is formed with a gravure coater into ceramic green sheets of 1.0 μm in thickness to prepare ceramic green sheets for forming the inner layer portion 14.

Likewise, a ceramic raw material powder for forming the first outer layers 22a and a ceramic raw material powder for forming the second outer layers 22b are also each formed into ceramic green sheets to prepare ceramic green sheets for forming the first outer layers 22a and ceramic green sheets for forming the second outer layers 22b.

The ceramic raw material powder for forming the second outer layer 22b is the same as the ceramic raw material powder for forming the inner layer portion 14.

On the other hand, the ceramic raw material powder for forming the first outer layers 22a is prepared as follows.

For example, first, a $CaCO_3$ powder and a $ZrO_2$ powder are weighed so that the ratio of Zr/Ti is 1.000, and subjected to wet mixing with a mill that uses $ZrO_2$ balls. This mixed slurry is dried, and then heated to 1100° C. to provide a $CaZrO_3$ powder of 0.25 μm in average particle size. Then, to 100 parts by mol of the $CaZrO_3$ powder, 1.0 part by mol of $MnCO_3$ and 1.5 parts by mol of $SiO_2$ are each added as a powder. Subsequently, the mixture is mixed with a mill that uses $ZrO_2$ balls in pure water as a dispersion medium. The mixture is dried, and then subjected to particle size regulation to provide a ceramic raw material powder for forming the first outer layers 22a.

Subsequently, onto the ceramic green sheets formed from the ceramic raw material powder for forming the inner layer portion 14, a conductive paste (for example, Ni paste) prepared separately is applied by screen printing, thus forming conductive film patterns to define and function as internal electrodes. The conductive film patterns are formed by, for example, screen printing or gravure printing. The multiple ceramic green sheets with the conductive film patterns formed are laminated so as to alternate the sides to which the conductive film patterns are extended, thus providing a portion corresponding to the inner layer portion 14.

Next, the ceramic green sheets with no conductive film patterns formed for forming the second outer layers 22b are laminated so as to sandwich the inner layer portion 14. Then, furthermore, the ceramic green sheets for forming the first outer layers 22a are laminated outside of the ceramic green sheets for forming the second outer layers 22b to form portions corresponding to the outer layer portions 16. In this way, a mother laminated body is prepared.

It is to be noted that the ceramic green sheets for forming the first outer layers 22a to define and function as the first ceramic dielectric layers 26 after firing and the ceramic green sheets for forming the first outer layers 22b and ceramic dielectric layers 18 to define and function as the second ceramic dielectric layers 28 are preferably formed in a way that such dielectric materials that differ in color after firing are selected as respectively described above. For example, a perovskite-type compound where the A-site element and the B-site element respectively have stable valences of +2 and +4, such as $CaZrO_3$, is used for the first ceramic dielectric layers 26, whereas a perovskite-type compound where the A-site element has a stable valence of +2, while the B-site element has a valence varied depending on the firing atmosphere, such as $BaTiO_3$, is used for the second ceramic dielectric layers 28. $CaZrO_3$ provides white ceramics, even in the case of containing minute amounts of elements, such as Mn, that have valences easily varied depending on the firing atmosphere. $BaTiO_3$ has a color that is able to be controlled by adjusting the additive amounts of elements, such as Mn, that have valences easily varied depending on the firing atmosphere.

In addition, because calcium zirconate is higher in Young's modulus than barium titanate, the use of high dielectric constant $BaTiO_3$ for the inner layer portion 14 and of $CaZrO_3$ or the like for the outer layer portions 16 prevents the multilayer ceramic capacitor from vibrating due to the electrostrictive effect of the dielectric ceramics. Therefore, the vibration of a circuit board due to the electrostrictive effect, sound-generating phenomenon referred to as so-called acoustic noise, which is caused when the multilayer ceramic capacitor is mounted on the circuit board, is significantly reduced or prevented.

Next, this mother laminated body was cut into green laminated chips so as to have a desired size. Then, these green laminated bodies were subjected to heat treatment at 270° C. in a $N_2$ atmosphere to burn and remove the binder. Thereafter, the green laminated chips with the binder burned and removed therefrom is subjected to firing for holding time of 5 minutes at 1220° C. while the rate of temperature increase is 30° C./min at 800° C. or higher in a reducing atmosphere composed of a $N_2$—$H_2$-$H_2O$ gas, thus providing the laminated body 12 where the boundary reaction layers 24 are formed which contain at least one element other than oxygen among the elements constituting the oxide as the main constituent of the first outer layers 22a and contain at least one element other than oxygen among the elements constituting the oxide as the main constituent of the second outer layers 22b. Further, barrel polishing may be carried out before or after the firing, in order to round corners of the green laminated chips or the laminated body 12.

Furthermore, a conductive paste containing Cu as its main constituent is applied to the both end surface parts of the laminated body 12 to which the conductive film patterns to define and function as the internal electrodes 20 are extended, and baked at a predetermined temperature to form underlying electrodes. These underlying electrodes are subjected to nickel plating and tin plating by, for example, wet plating, thus forming the external electrodes 30. In this way, the desired multilayer ceramic capacitor 10 is obtained.

EXPERIMENTAL EXAMPLE

In an experimental example, the following multilayer ceramic capacitors according to Examples 1 to 4 and Comparative Examples 1 to 3 were manufactured to evaluate the multilayer ceramic capacitors for bending strength and outer layer discrimination.

Example 1

1. Preparation of Ceramic Raw Material Powder for Forming Inner Layer Portion

The ceramic raw material powder for forming the inner layer portion 14 was prepared by the method described below. A $BaCO_3$ powder and a $TiO_2$ powder were weighed so that the ratio of Ba/Ti was 1.001, and subjected to wet mixing with a mill using $ZrO_2$ balls. This mixed slurry was dried, and then heated to 1000° C. to provide a $BaTiO_3$ powder of 0.16 μm in average particle size. Then, to 100 parts by mol of the $BaTiO_3$ powder, 1.0 part by mol of Dy, 1.2 parts by mol of Mg, 0.2 part by mol of Mn, and 1.0 part by mol of Ba were each added as a metal soap solution, and 1.5 parts by mol of Si was further added as an alkoxide. Subsequently, the mixture was subjected to wet mixing with a mill using $ZrO_2$ balls in a mixing system of toluene and ethyl alcohol as a dispersion medium. After the removal of the dispersion medium, the mixture was subjected to heat treatment at 500° C. to remove the organic component, and subjected to particle size regulation to prepare a ceramic raw material powder for forming the inner layer portion 14.

2. Preparation of Ceramic Raw Material Powder for Forming Outer Layer Portion

The ceramic raw material powder for forming the second outer layer 22b in the outer layer portions 16 was made from the same materials as the materials used in preparing the ceramic raw material powder for forming the inner layer portion 14. Therefore, the main constituent of the ceramic raw material powder for forming the second outer layers 22b is $BaTiO_3$.

On the other hand, the ceramic raw material powder for forming the first outer layers 22a was prepared as follows. First, a $CaCO_3$ powder and a $ZrO_2$ powder were weighed so that the ratio of Zr/Ti was 1.000, and subjected to wet mixing with a mill using $ZrO_2$ balls.

This mixed slurry was dried, and then heated to 1100° C. to provide a $CaZrO_3$ powder of 0.25 μm in average particle size. To 100 parts by mol of the $CaZrO_3$ powder, 1.0 part by mol of $MnCO_3$ and 1.5 parts by mol of $SiO_2$ were each added as a powder, and the mixture was subjected to wet mixing with a mill using $ZrO_2$ balls in pure water as a dispersion medium. The mixture was dried, and then subjected to particle size regulation to prepare a ceramic raw material powder for forming the first outer layers 22a.

3. Preparation of Multilayer Ceramic Capacitor

The ceramic raw material powder for forming the inner layer portion 14 was, with the addition of a polybutyral-based binder and a plasticizer thereto, and with the addition of toluene and ethyl alcohol thereto, subjected to wet mixing with a mill using $ZrO_2$ balls, thus providing slurry. Next, this slurry was formed with a gravure coater into ceramic green sheets of 1.0 μm in thickness. Likewise, the ceramic raw material powder for forming the first outer layers 22a and the ceramic raw material powder for forming the second outer layers 22b were also formed into ceramic green sheets.

Onto the ceramic green sheets formed from the ceramic raw material powder for forming the inner layer portion 14, a Ni-containing conductive paste prepared separately was applied by screen printing, thus forming conductive film patterns to define and function as internal electrodes 14. Thereafter, 400 of the sheets were laminated so as to alternate the sides to which the conductive film patterns were extended, thus providing the inner layer portion 14.

Subsequently, a mother laminated body was prepared by laminating 48 μm of the ceramic green sheets formed from the ceramic raw material powder for forming the second outer layers 22b so as to sandwich the inner layer portion 14, and further laminating, on both outer sides of the laminate, 7 μm of the ceramic green sheets formed from the ceramic raw material powder for forming the first outer layers 22a. This mother laminated body was cut into green laminated chips so as to have a desired size.

The thus prepared green laminated chips were subjected to heat treatment at 270° C. in a $N_2$ atmosphere to burn and remove the binder. Thereafter, the chips were subjected to firing for holding time of 5 minutes at 1220° C. while the rate of temperature increase was 30° C./min at 800° C. or higher in a reducing atmosphere composed of a $N_2$—$H_2$—$H_2O$ gas. The laminated body 12 obtained was 1.2 mm in length, 0.7 mm in width, and 0.7 mm in height in terms of size, and prismatic in terms of shape while being square in cross section. A conductive film paste containing Cu as its main constituent was applied to both end surface portions of the laminated body 12 obtained, with the extended conductive film patterns to define and function as the internal electrodes 20, and baked at 800° C. to form underlying electrodes. Furthermore, surface layers of the underlying electrodes were subjected to nickel plating and tin plating by wet plating to form the external electrodes 30. Then, a multilayer ceramic capacitor was obtained as shown in FIG. 2.

It is to be noted that the element portion of the multilayer ceramic capacitor obtained in this way was 0.85 μm in thickness.

Example 2

In Example 2, after the inner layer portion 14 was obtained in the same way as in Example 1, on only one side thereof, the ceramic green sheets formed from the ceramic raw material powder for forming the second outer layers 22b were laminated to reach 48 μm, and further on the surface of the sheets, the ceramic green sheets formed from the ceramic raw material powder for forming the first outer layers 22a were laminated to reach 7 μm. On the other hand, on the other side of the inner layer portion 14, the ceramic green sheets formed from the ceramic raw material powder for forming the inner layer portion 14 were laminated to reach 55 μm, thus preparing a mother laminated body. Thereafter, a multilayer ceramic capacitor according to Example 2 as shown in FIG. 3 was obtained by cutting the mother laminated body into green laminated chips, firing the chips, and forming the external electrodes 30 in the same way as in Example 1.

Example 3

In Example 3, the oxide as the main constituent of the first outer layers 22a was $SrZrO_3$, unlike Example 1. In order to prepare ceramic green sheets formed from a ceramic raw material powder for forming the first outer layers 22a, first, a $SrCO_3$ powder and a $ZrO_2$ powder were weighed so that the ratio of Sr/Zr was 1.000, mixed and ground with a mill using $ZrO_2$ balls, and then heated to 1050° C. to provide a $SrZrO_3$ powder. To 100 parts by mol of the $SrZrO_3$ powder, 1.0 part by mol of $MgCO_3$ and 2.5 parts by mol of $SiO_2$ were each added as a powder, and the mixture was subjected to wet mixing with a mill using $ZrO_2$ balls in pure water as a dispersion medium. The mixture was dried, and then subjected to particle size regulation to prepare a ceramic raw material powder for forming the first outer layers 22a for use in Example 3.

Then, after the inner layer portion 14 was obtained in the same way as in Example 1, a mother laminated body was prepared by laminating 48 μm of the ceramic green sheets formed from the ceramic raw material powder for forming the second outer layers 22b so as to sandwich the inner layer portion 14, and further laminating, on the surface of the laminate, 7 μm of the ceramic green sheets formed from the ceramic raw material powder for forming the first outer layers 22a. Thereafter, a multilayer ceramic capacitor according to Example 3 was obtained by cutting the mother laminated body into green laminated chips, firing the chips, and forming the external electrodes 30 in the same way as in Example 1.

Example 4

In Example 4, the oxide as the main constituent of the first outer layers 22a was $(Ba_{0.2}Sr_{0.8})TiO_3$, unlike Example 1. In order to prepare ceramic green sheets formed from a ceramic raw material powder for forming the first outer layers 22a, first, a $SrCO_3$ powder, a $BaCO_3$ powder, and a $TiO_2$ powder were mixed and ground, and then heated to 1050° C. to provide a $(Ba_{0.2}Sr_{0.8})TiO_3$ powder. To 100 parts by mol of the $(Ba_{0.2}Sr_{0.8})TiO_3$ powder, 2.0 parts by mol of $MgCO_3$, 1.5 parts by mol of $SiO_2$, and 0.5 part by mol of $Li_2O$ were each added as a powder, and the mixture was subjected to wet mixing with a mill using $ZrO_2$ balls in pure water as a dispersion medium. The mixture was dried, and then subjected to particle size regulation to prepare a ceramic raw material powder for forming the first outer layers 22a for use in Example 4.

Then, after the inner layer portion 14 was obtained in the same way as in Example 1, a mother laminated body was prepared by laminating 48 μm of the ceramic green sheets formed from the ceramic raw material powder for forming the second outer layers 22b so as to sandwich the inner layer portion 14, and further laminating, on the surface of the laminate, 7 μm of the ceramic green sheets formed from the ceramic raw material powder for forming the first outer layers 22a. Thereafter, a multilayer ceramic capacitor according to Example 4 was obtained by cutting the mother laminated body into green laminated chips, firing the chips, and forming the external electrodes 30 in the same way as in Example 1.

Comparative Example 1

In Comparative Example 1, $BaTiO_3$ of the same as the ceramic raw material powder for forming the inner layer portion 14 was used as the ceramic raw material powder for forming the outer layer portions 16, unlike Example 1. Then, a multilayer ceramic capacitor according to Comparative Example 1 was obtained by cutting the mother laminated body into green laminated chips, firing the chips, and forming the external electrodes 30 to prepare a multilayer ceramic capacitor in the same way as in Example 1.

Comparative Example 2

In Comparative Example 2, the oxide as the main constituent of the first outer layers 22a was $Ba(Ti_{0.05}Zr_{0.95})O_3$, unlike Example 1. In order to prepare ceramic green sheets formed from a ceramic raw material powder for forming the first outer layers 22a, first, a $BaCO_3$ powder, a $TiO_2$, and a $ZrO_2$ powder were mixed and ground, and then heated to 1050° C. to provide a $Ba(Ti_{0.05}Zr_{0.95})O_3$ powder. To 100 parts by mol of the $Ba(Ti_{0.05}Zr_{0.95})O_3$ powder, 0.25 part by mol of $MnCO_3$ and 1.5 parts by mol of $SiO_2$ were each added as a powder, and the mixture was subjected to wet mixing with a mill using $ZrO_2$ balls in pure water as a dispersion medium. The mixture was dried, and then subjected to particle size regulation to prepare a ceramic raw material powder for forming the first outer layers 22a for use in Comparative Example 2.

Then, after the inner layer portion 14 was obtained in the same way as in Example 1, a mother laminated body was prepared by laminating 48 μm of the ceramic green sheets formed from the ceramic raw material powder for forming the second outer layers 22b so as to sandwich the inner layer portion 14, and further laminating, on the surface of the laminate, 7 μm of the ceramic green sheets formed from the ceramic raw material powder for forming the first outer layers 22a. Thereafter, a multilayer ceramic capacitor according to Comparative Example 2 was obtained by cutting the mother laminated body into green laminated chips, firing the chips, and forming the external electrodes 30 in the same way as in Example 1.

Comparative Example 3

In Comparative Example 3, the oxide as the main constituent of the first outer layers 22a was $CaZrO_3$ like Example 1, while the additive for use in preparing the oxide differs in composition. To 100 parts by mol of the $CaZrO_3$ powder, 5.0 parts by mol of $MnCO_3$ and 2.0 parts by mol of $SiO_2$ were each added as a powder, and the mixture was subjected to wet mixing with a mill using $ZrO_2$ balls in pure water as a dispersion medium. The mixture was dried, and then subjected to particle size regulation to prepare a ceramic raw material powder for forming the first outer layers 22a for use in Comparative Example 3.

Then, after the inner layer portion 14 was obtained in the same way as in Example 1, a mother laminated body was prepared by laminating 48 μm of the ceramic green sheets formed from the ceramic raw material powder for forming the second outer layers 22b so as to sandwich the inner layer portion 14, and further laminating, on the surface of the laminate, 7 μm of the ceramic green sheets formed from the ceramic raw material powder for forming the first outer layers 22a. Thereafter, a multilayer ceramic capacitor according to Comparative Example 3 was obtained by cutting the mother laminated body into green laminated chips, firing the chips, and forming the external electrodes 30 in the same way as in Example 1.

4. Characterization in Example and Comparative Example

The respective multilayer ceramic capacitors according to the examples and the comparative examples were subjected to the following characterization.

Whether Boundary Reaction Layer is Formed or not

Cross sections (cross sections LT) of the multilayer ceramic capacitors 10 according to the respective examples and the respective comparative examples in the height direction (direction T) and length direction (direction L) in FIG. 1 were exposed by polishing with the capacitors wrapped with a resin, the general outer layer portions were observed through reflection electron images under a scanning electron microscope (SEM), and element analyses were conducted by wavelength-dispersive X-ray spectroscopy (WDX) to confirm whether boundary reaction layers were formed or not. It is to be noted that the polishing was carried out to a depth on the order of ½ in the width direction.

Discrimination Between Color of Surface of First Outer Layer and Color of Surface of Inner Layer Portion The colors of the surfaces of the first outer layers 22a were discriminated visually from the color of the surface of the inner layer portion 14.

Bending Strength Test

Furthermore, central portions of the multilayer ceramic capacitors in the length direction were subjected to a bending test in conformity with the JIS standards (JISR1601) to conduct the evaluation of mechanical strength. The number of measurement samples was 20 for each of the examples and for each of the comparative examples, and the results were calculated as average values for the 20 samples. The determination was made on the basis of $25 \le P$ (N/mm²) in terms of average bending strength P, from the structures of the multilayer ceramic capacitors prepared in the respective examples and the respective comparative examples. When the average bending strength P meets $25 \le P$ (N/mm²), the result is shown as "○", or if not, shown as "x". The results are shown in Table 1.

TABLE 1

| | Main Constituent of Ceramic of Outer layer portion | | Boundary Reaction Layer | | | Bending Strength Test |
|---|---|---|---|---|---|---|
| | Second Outer Layer | First Outer Layer | Formed or Not | Detected Element | Outer Layer Discrimination | 25 N/mm² or more |
| Example 1 | $BaTiO_3$ | $CaZrO_3$ | Yes | Ba, Ca | Possible | ○ |
| Example 2 | $BaTiO_3$ | $CaZrO_3$ | Yes | Ba, Ca | Possible | ○ |
| Example 3 | $BaTiO_3$ | $SrZrO_3$ | Yes | Ba, Sr | Possible | ○ |
| Example 4 | $BaTiO_3$ | $(Ba_{0.2}Sr_{0.8})TiO_3$ | Yes | Ba, Sr, Ti | Possible | ○ |
| * Comparative Example 1 | Same Main Constituent in Outer layer portion and Inner Layer | | No | — | Impossible | ○ |
| * Comparative Example 2 | $BaTiO_3$ | $Ba(Ti_{0.05}Zr_{0.95})O_3$ | No | — | Impossible | x |
| * Comparative Example 3 | $BaTiO_3$ | $CaZrO_3$ | Yes | Ba, Ca | Impossible | ○ |

* Outside of the scope of the present invention

Table 1 shows the presence or absence of the boundary reaction layers 24, availability of outer layer discrimination, and the results of the bending strength test, for each case of using the main constituent of the ceramic raw material powder for forming the first outer layers 22a and the main constituent of the ceramic raw material powder for forming the second outer layers 22b in the respective examples and the respective comparative examples.

In Examples 1 through 4, it has been successfully confirmed from the reflection electron images that the boundary reaction layers 24 are formed in the outer layer portions 16. In addition, it has been successfully confirmed from the wavelength-dispersive X-ray spectroscopy that the boundary reaction layers 24 contain at least one element other than oxygen among the elements constituting the main constituent of the first outer layers 22a, and at least one element other than oxygen among the elements constituting the main constituent of the second outer layers 22b. In this spectroscopy, when an element was detected as 0.1 wt % or more, the element was considered to be contained. More specifically, 0.1 wt % or more of Ba and Ca were detected from the boundary reaction layers 24 in Examples 1 and 2, 0.1 wt % or more of Ba and Sr were detected in Example 3, and 0.1 wt % or more of Ba, Sr, and Ti were detected in Example 4. In addition, the surfaces of the first outer layers 22a were white in Examples 1 through 3, and somewhat dusky-white in Example 4. Thus, it has been possible to discriminate the surfaces from the brownish surfaces of the side surfaces determined by the height direction and the length direction in FIG. 1. Furthermore, in Examples 1 through 4, it has been successfully confirmed that the first outer layers 22a and the second outer layers 22b are strongly coupled through the formation of the boundary reaction layers 24. In addition, Examples 1 through 4 all meet the condition for passing the bending strength test, and it has been successfully confirmed that there is no problem when the multilayer ceramic capacitors according to the respective examples are mounted on boards.

On the other hand, Comparative Example 1 has failed to achieve the outer layer discrimination, because of using the ceramic raw material powders composed of the same main constituent for the first ceramic dielectric layers and the second ceramic dielectric layers.

In addition, in Comparative Example 2, on the preparation as a multilayer ceramic capacitor, substantially 30% of the boundary surface was partially peeled at the boundary between the first outer layer 22a and the second outer layer 22b. In addition, while the bending strength test was conducted after sorting uncracked samples from the standpoint of appearance under a stereoscopic microscope, many samples peeled partially at the boundary between the first outer layer 22a and the second outer layer 22b after the test, and the bending strength test was thus determined to be "x".

Moreover, in Comparative Example 3, boundary reaction layers were formed between the first outer layers 22a and the second outer layers 22b, it was not possible to discriminate between the color of the surfaces of the first outer layers and the color of the surface of the inner layer portion (outer layer discrimination).

It is to be noted that the present invention is not to be considered limited to the previously described preferred embodiments, but various modifications are made within the spirit and scope of the present invention. In addition, the thickness and number of ceramic layers, opposed electrode area, and the external dimensions of the multilayer ceramic capacitor are not to be considered limited thereto.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
   a laminated body including an inner layer portion including a plurality of first ceramic dielectric layers laminated and internal electrodes provided on the plurality of first ceramic dielectric layers; and
   an outer layer portion including a plurality of second ceramic dielectric layers laminated outside the inner layer portion, the plurality of second ceramic dielectric layers having no internal electrodes provided thereon; and
   external electrodes provided on both ends of the laminated body; wherein
   the inner layer portion contains, as a main constituent, a perovskite compound represented by $ABO_3$, where A represents one or more of Ba, Sr, and Ca, B represents one or more of Ti, Zr, and Hf, and O represents oxygen;
   the outer layer portion includes at least a first outer layer containing an oxide as a main constituent, the first outer layer being an outermost layer, and a second outer layer containing, as a main constituent, an oxide that is different from the oxide of the first outer layer;
   a boundary reaction layer is disposed between the first outer layer and the second outer layer;
   the boundary reaction layer contains at least one element other than oxygen among elements constituting the oxide in the first outer layer adjacent to the boundary reaction layer, and at least one element other than oxygen among elements constituting the oxide in the second outer layer adjacent to the boundary reaction layer; and
   a surface of the first outer layer differs in color from a surface of the inner layer portion.

2. The multilayer ceramic capacitor according to claim 1, wherein the oxide in the second outer layer is a perovskite compound.

3. The multilayer ceramic capacitor according to claim 2, wherein the oxide in the first outer layer is a perovskite compound.

4. The multilayer ceramic capacitor according to claim 1, wherein the laminated body has a cuboid shape.

5. The multilayer ceramic capacitor according to claim 1, wherein the plurality of first dielectric layers and the plurality of second dielectric layers each have a thickness of about 0.5 μm to about 5 μm.

6. The multilayer ceramic capacitor according to claim 1, wherein the outer layer portion is a first outer layer portion, and a second outer layer portion is provided in the laminated body such that the inner layer portion is located between the first and second outer layer portions.

7. The multilayer ceramic capacitor according to claim 6, wherein the first outer layer portion has a different thickness than that of the second outer layer portion.

8. The multilayer ceramic capacitor according to claim 6, wherein the second outer layer portion includes a third outer layer and a fourth outer layer, and a boundary reaction layer disposed between the third outer layer and the fourth outer layer.

9. The multilayer ceramic capacitor according to claim 6, wherein the second outer layer portion does not include a boundary reaction layer.

10. The multilayer ceramic capacitor according to claim 1, wherein the plurality of first ceramic dielectric layers are different in color from the plurality of second ceramic dielectric layers.

11. The multilayer ceramic capacitor according to claim 1, wherein the plurality of first ceramic dielectric layers are white.

12. The multilayer ceramic capacitor according to claim 1, wherein the external electrodes extend along both ends in a longer direction of the laminated body.

13. The multilayer ceramic capacitor according to claim 1, wherein the external electrodes wrap around four side surfaces from end surfaces of the laminated body.

14. The multilayer ceramic capacitor according to claim 1, wherein the external electrodes include underlying sintered metal paste layers and plating layers on the underlying sintered metal paste layers.

15. A method of determining an orientation of an electronic component, the method comprising the steps of:
  providing the multilayer ceramic capacitor according to claim 1;
  determining a difference in color between the surface of the first outer layer and the surface of the inner layer portion; and
  determining a positional relationship of the multilayer ceramic capacitor based on a result of the step of determining the difference in color.

16. The method according to claim 15, further comprising the step of aligning and mounting the multilayer ceramic capacitor on a board or substrate based on a result of the step of determining the orientation of the internal electrodes.

* * * * *